(12) United States Patent
Tan et al.

(10) Patent No.: US 10,658,194 B2
(45) Date of Patent: May 19, 2020

(54) SILICON-BASED DEPOSITION FOR SEMICONDUCTOR PROCESSING

(71) Applicant: Lam Research Corporation, Fremont, CA (US)

(72) Inventors: Zhongkui Tan, San Jose, CA (US); Qing Xu, Fremont, CA (US); Qian Fu, Pleasanton, CA (US); Hua Xiang, Pleasanton, CA (US); Lin Zhao, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/244,311

(22) Filed: Aug. 23, 2016

(65) Prior Publication Data
US 2018/0061659 A1 Mar. 1, 2018

(51) Int. Cl.
| | |
|---|---|
| H01L 27/108 | (2006.01) |
| H01L 21/32 | (2006.01) |
| H01L 21/311 | (2006.01) |
| H01L 21/3065 | (2006.01) |
| H01L 21/02 | (2006.01) |
| H01J 37/32 | (2006.01) |
| C23C 16/52 | (2006.01) |
| C23C 16/50 | (2006.01) |
| C23C 16/455 | (2006.01) |

(52) U.S. Cl.
CPC ........ *H01L 21/32* (2013.01); *C23C 16/45544* (2013.01); *C23C 16/50* (2013.01); *C23C 16/52* (2013.01); *H01J 37/32009* (2013.01); *H01J 37/32449* (2013.01); *H01L 21/02164* (2013.01); *H01L 21/3065* (2013.01); *H01L 21/31116* (2013.01); *H01L 21/31138* (2013.01); *H01L 21/31144* (2013.01); *H01L 21/0212* (2013.01); *H01L 21/0228* (2013.01); *H01L 21/02118* (2013.01); *H01L 21/02126* (2013.01); *H01L 21/02271* (2013.01); *H01L 21/02274* (2013.01); *H01L 27/1087* (2013.01)

(58) Field of Classification Search
None
See application file for complete search history.

(56) References Cited

U.S. PATENT DOCUMENTS

| | | | |
|---|---|---|---|
| 5,545,290 A | 8/1996 | Douglas | |
| 7,141,505 B2 | 11/2006 | Nguyen et al. | |
| 2007/0026677 A1* | 2/2007 | Ji | H01L 21/31144 438/689 |
| 2009/0159560 A1* | 6/2009 | Kiehlbauch | H01L 21/31116 216/17 |

(Continued)

FOREIGN PATENT DOCUMENTS

| | | | |
|---|---|---|---|
| WO | 2005/071721 | 8/2005 | |
| WO | 2014/010499 | * 1/2014 | |
| WO | WO-2014010499 A1 * | 1/2014 | ........ H01L 27/11556 |

*Primary Examiner* — Stephanie P Duclair
(74) *Attorney, Agent, or Firm* — Beyer Law Group LLP

(57) ABSTRACT

A method for processing a substrate in a processing chamber, comprising forming a deposition over the substrate is provided. A silicon containing gas is flowed into the processing chamber. A COS containing gas is flowed into the processing chamber. A plasma is formed from the silicon containing gas and the COS containing gas in the processing chamber, wherein the plasma provides the deposition over the substrate.

13 Claims, 6 Drawing Sheets

(56) References Cited

U.S. PATENT DOCUMENTS

| | | | |
|---|---|---|---|
| 2011/0045672 A1* | 2/2011 | Srinivasan | C23F 4/00 |
| | | | 438/696 |
| 2015/0083582 A1* | 3/2015 | Dhindsa | H01L 21/3065 |
| | | | 204/192.37 |
| 2015/0087154 A1* | 3/2015 | Guha | H01L 21/31144 |
| | | | 438/703 |
| 2015/0303069 A1* | 10/2015 | Narishige | H01L 27/11556 |
| | | | 438/696 |

* cited by examiner

SILICON-BASED DEPOSITION FOR SEMICONDUCTOR PROCESSING

BACKGROUND

The disclosure relates to a method of forming semiconductor devices on a semiconductor wafer. More specifically, the disclosure relates forming a silicon-based deposition in the formation of semiconductor devices.

In forming semiconductor devices, various layers are deposited.

SUMMARY

To achieve the foregoing and in accordance with the purpose of the present disclosure, a method for processing a substrate in a processing chamber, comprising forming a deposition over the substrate is provided. A silicon containing gas is flowed into the processing chamber. A COS containing gas is flowed into the processing chamber. A plasma is formed from the silicon containing gas and the COS containing gas in the processing chamber, wherein the plasma provides the deposition over the substrate.

These and other features of the present disclosure will be described in more detail below in the detailed description of embodiments and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present embodiments will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
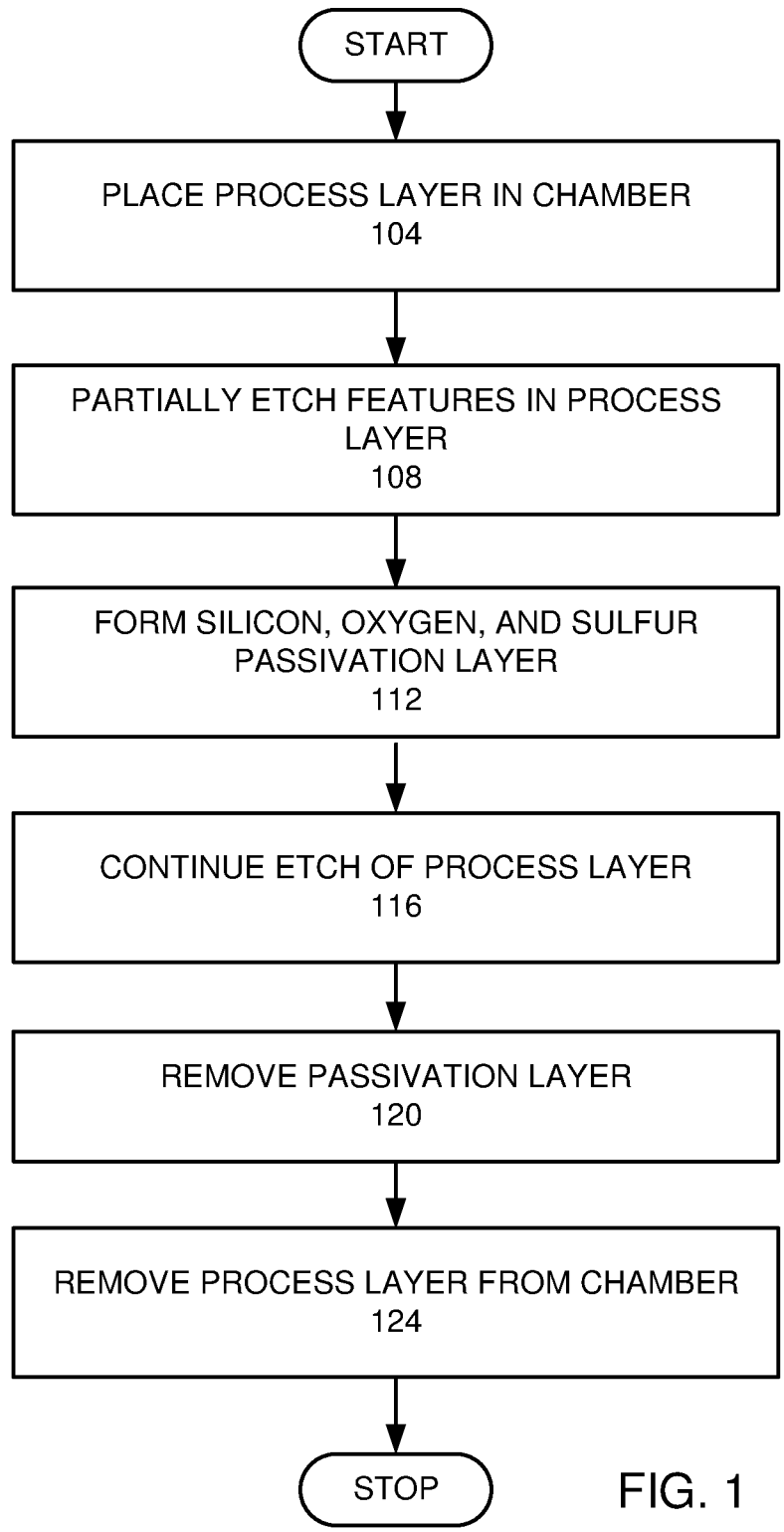
FIG. 1 is a high level flow chart of an embodiment.

FIG. 1 is a high level flow chart of an embodiment. In this embodiment, a process layer is placed in a process chamber (step 104). Features are partially etched into the process layer (step 108). A passivation layer comprising silicon, oxygen, and sulfur is deposited over the partially etched features (step 112). The etching of the features in the process layer is continued (step 116). The passivation layer is removed (step 120). The process layer is removed from the process chamber (step 124).

Example

Figure 2A:
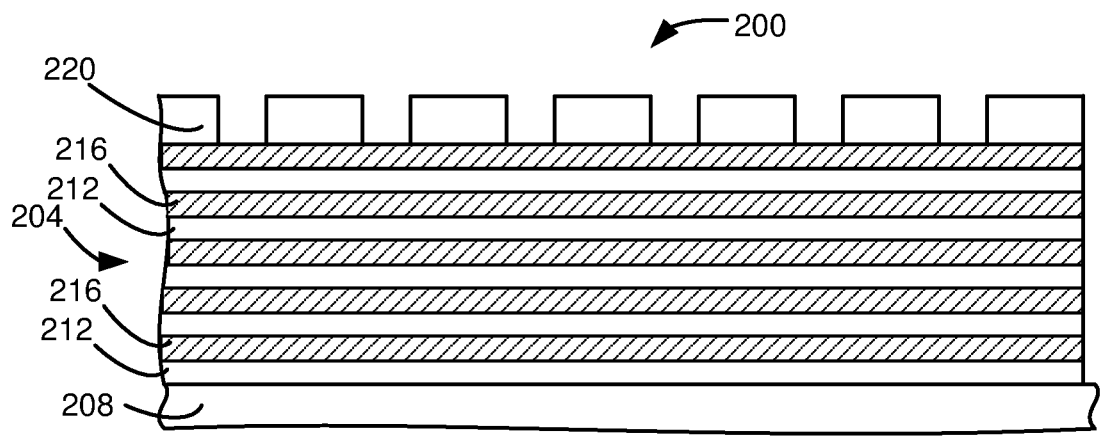
FIGS. 2A-E are schematic cross-sectional views of a stack processed according to an embodiment.

In a preferred embodiment, the process layer comprises an ONON (silicon oxide, silicon nitride, silicon oxide, silicon nitride and repeating) stack. FIG. 2A is a schematic cross-sectional view of the substrate 208 with the process layer 204 under a patterned mask 220. One or more layers may be disposed between the process layer 204 and the substrate 208. In this embodiment, the process layer 204 is a plurality of memory stacks, which are formed by bilayers of a layer of silicon oxide ($SiO_2$) 216 on top of a layer of silicon nitride 212. The patterned mask 220 is a carbon hardmask.

Figure 3:
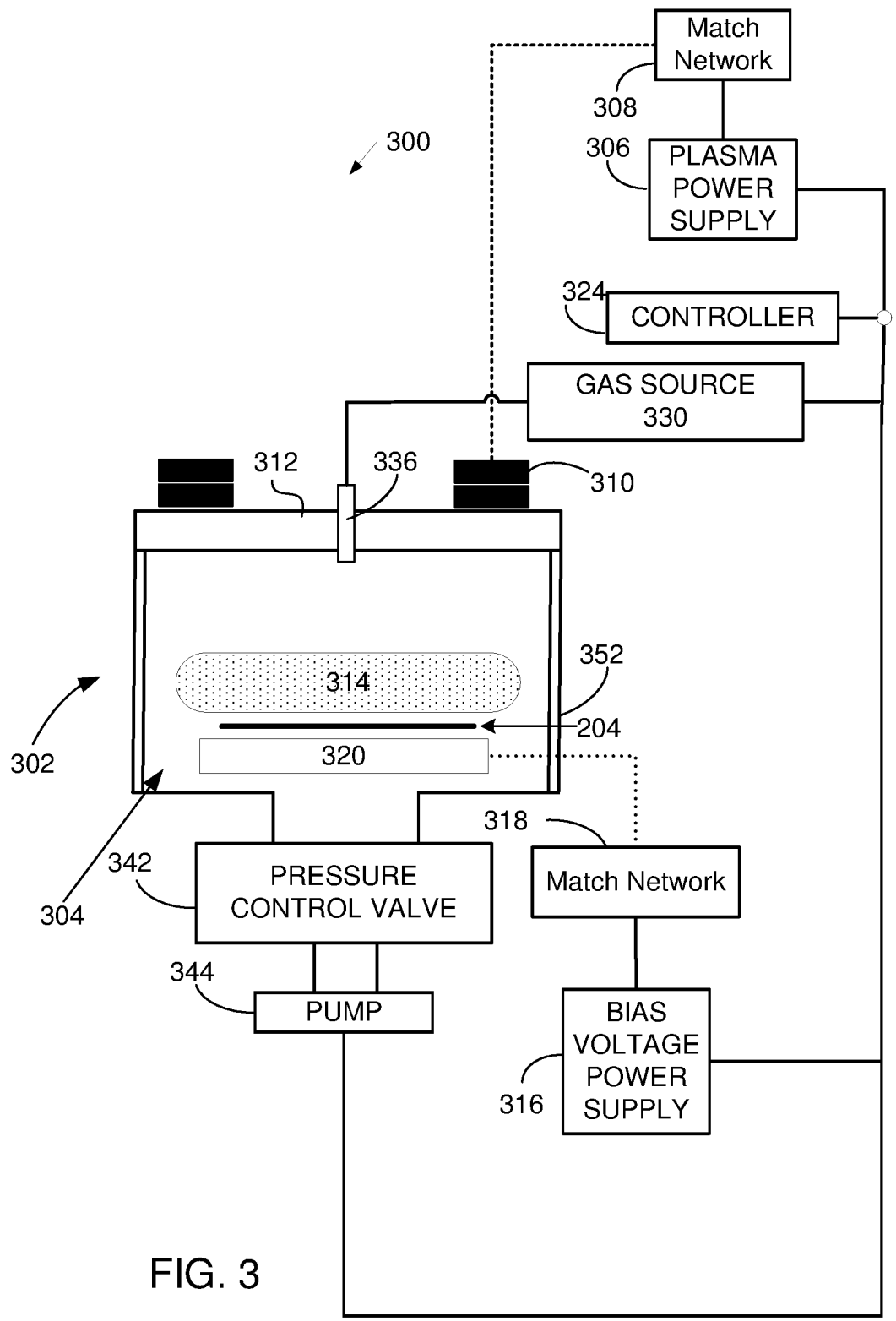
FIG. 3 is a schematic view of a etch chamber that may be used in an embodiment.

FIG. 3 schematically illustrates an example of a plasma processing system 300 which may be used to process the process layer 204 in accordance with one embodiment of the present invention. The plasma processing system 300 includes a plasma reactor 302 having a plasma processing chamber 304, enclosed by a chamber wall 352. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within the plasma processing chamber 304. For example, the TCP coil 310 may be configured to generate a toroidal power distribution in the plasma 314. The power window 312 is provided to separate the TCP coil 310 from the plasma processing chamber 304 while allowing energy to pass from the TCP coil 310 to the plasma processing chamber 304. A wafer bias voltage power supply 316 tuned by a match network 318 provides power to an electrode 320 to set the bias voltage on the process layer 204 which is supported over the electrode 320. A controller 324 sets points for the plasma power supply 306 and the wafer bias voltage power supply 316.

The plasma power supply 306 and the wafer bias voltage power supply 316 may be configured to operate at specific radio frequencies such as, 13.56 MHz, 27 MHz, 2 MHz, 400 kHz, or combinations thereof. Plasma power supply 306 and wafer bias voltage power supply 316 may be appropriately sized to supply a range of powers in order to achieve desired process performance. For example, in one embodiment of the present invention, the plasma power supply 306 may supply the power in a range of 50 to 5000 Watts, and the wafer bias voltage power supply 316 may supply a bias voltage of in a range of 20 to 2000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source/gas supply mechanism 330 provides gas to a gas feed 336 in the form of a nozzle. The process gases and byproducts are removed from the plasma processing chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. of Fremont, Calif., may be used to practice an embodiment of the invention.

Figure 4:
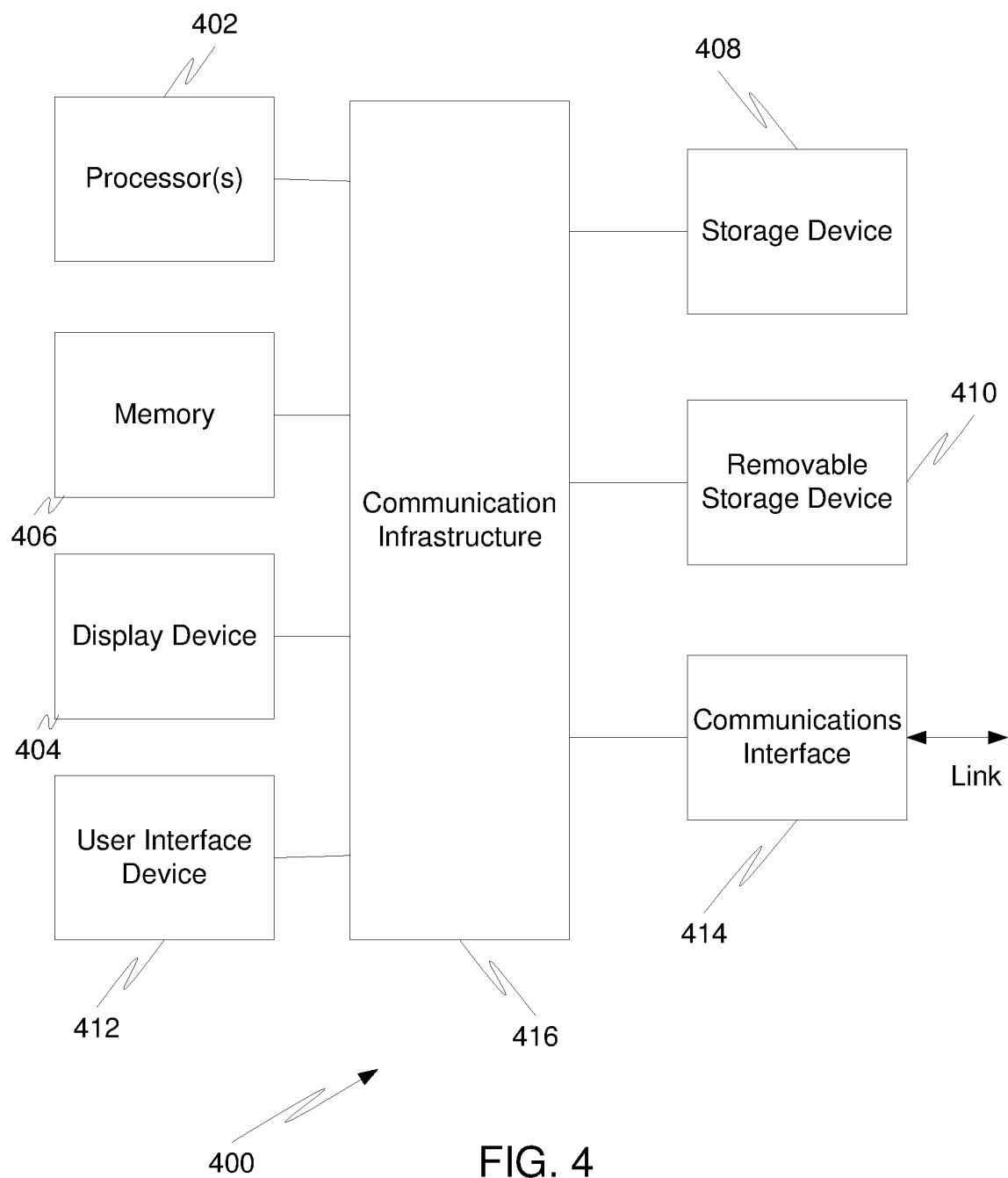
FIG. 4 is a schematic view of a computer system that may be used in practicing an embodiment.

FIG. 4 is a high level block diagram showing a computer system 400, which is suitable for implementing a controller 324 used in embodiments. The computer system may have many physical forms, ranging from an integrated circuit, a printed circuit board, and a small handheld device, up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory, and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
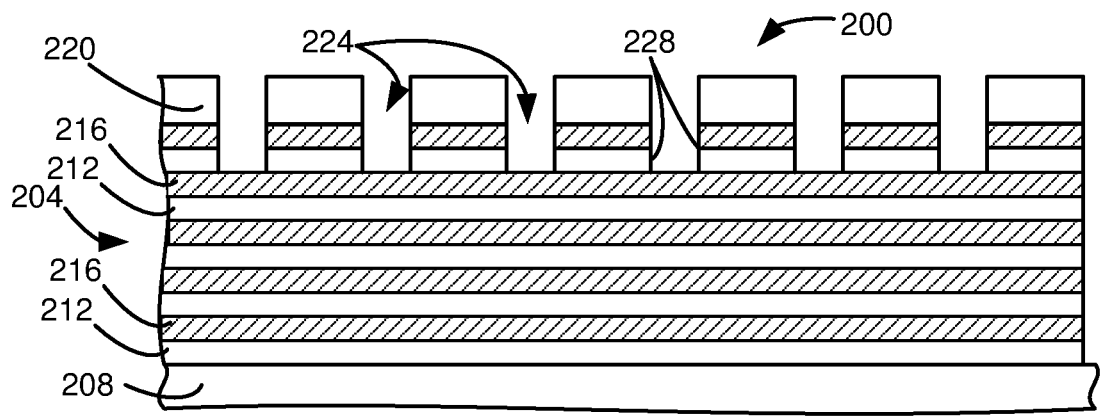

After the substrate 208 has been placed into the plasma processing system 300, features are partially etched into the process layer (step 108). In this example, where the process layer 204 is an ONON stack, an etch gas comprising $C_4F_6$, $O_2$, $NF_3$, $CH_2F_2$ is flowed into the plasma processing chamber 304 and transformed into a plasma in order to etch the ONON stack. FIG. 2B is a cross-sectional view of the stack 200 after the features are partially etched, forming etched features 224 with sidewalls 228.

Figure 2C:
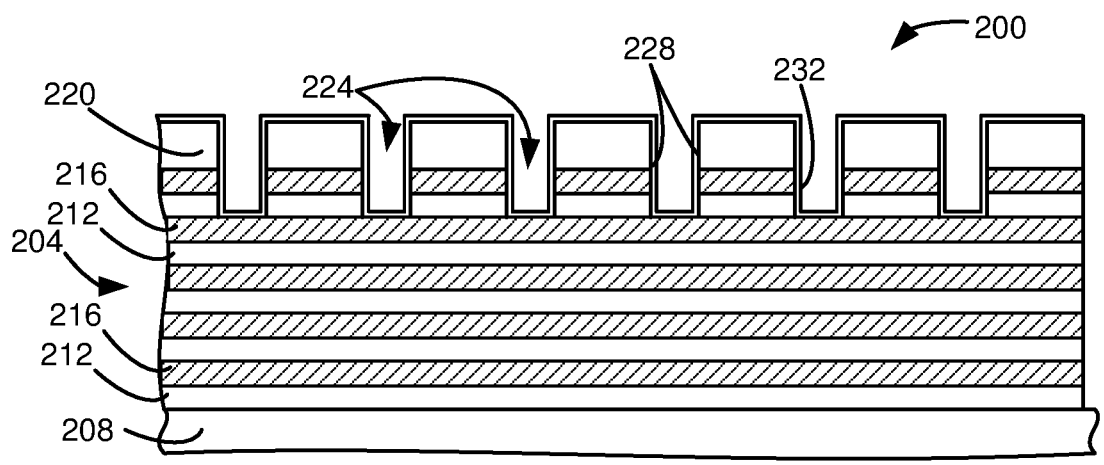
Figure 5:
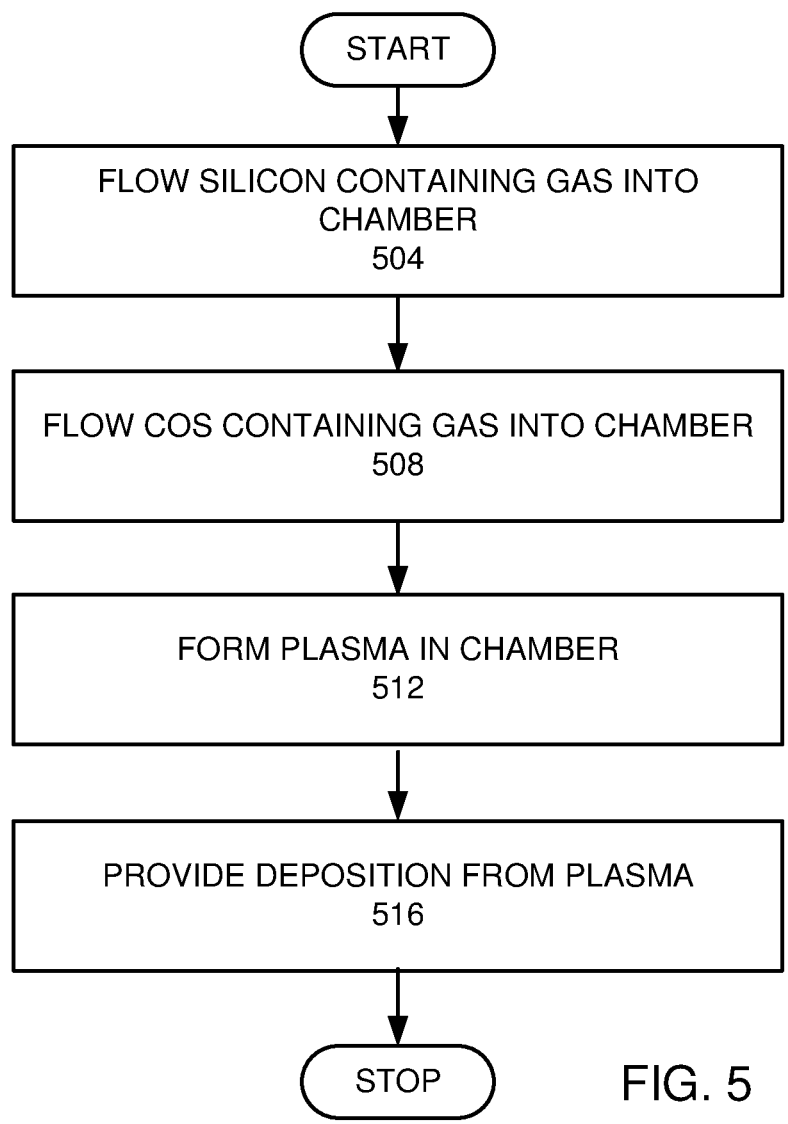
FIG. 5 is a detailed flow chart of a deposition layer formation step.

A passivation layer comprising silicon, oxygen, and sulfur is deposited over the process layer (step 112). FIG. 5 is a more detailed flow chart of an embodiment of depositing the passivation layer (step 112). A silicon containing gas is flowed into the plasma processing chamber 304 (step 504). A COS containing gas is flowed into the plasma processing chamber 304 (step 508). A plasma is formed in the plasma processing chamber 304 (step 512). Preferably, the plasma is an in situ plasma and non-remote. The plasma causes a deposition comprising silicon, oxygen, and sulfur to deposit on the process layer. Preferably, the deposition layer also comprises carbon. An example of a recipe for this process flows 100 sccm $SiCl_4$ and 100 sccm COS into the processing chamber 304 at a pressure of 50 mTorr. A plasma RF power of 2500 Watts is provided at a frequency of 13.56 MHz, which transforms the $SiCl_4$ gas and COS gas into a plasma. No bias is provided. The process is maintained for 10 seconds. The process is then stopped by stopping the flow of the gases and the RF power. For a feature with a width of about 50 to 100 nm, passivation is provided to a depth of about 1 to 4 microns. FIG. 2C is a cross-sectional view of the stack 200 after a passivation layer 232 has been deposited over the etched sidewalls 228 of the process layer 204. The figure is not drawn to scale in order to more clearly illustrate various features.

Figure 2D:
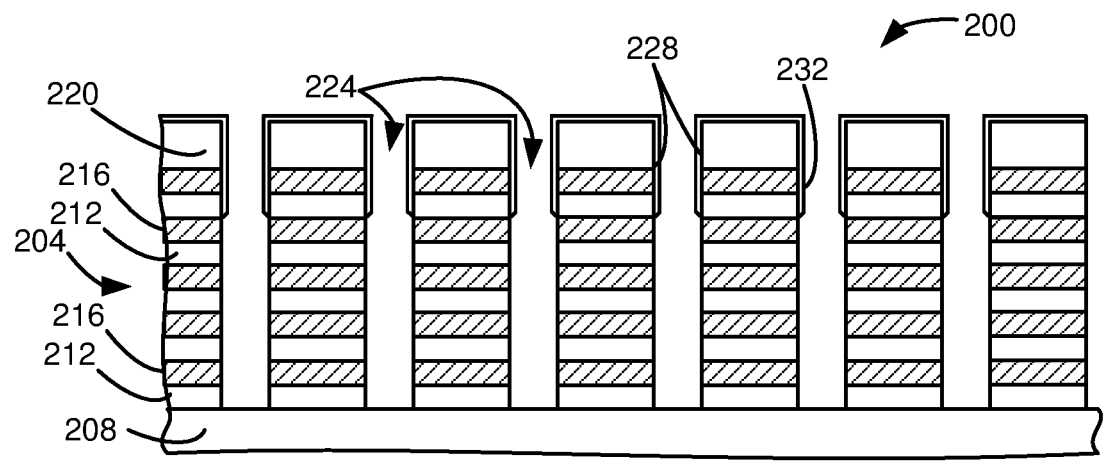

The etch process is then continued (step 116). In this embodiment, the etch process is continued until the process layer is completely etched. An etch recipe similar to the recipe used to partially etch the stack may be used here. FIG. 2D is a cross-sectional view of the stack 200 after a process layer 204 has been completely etched (step 116).

Figure 2E:
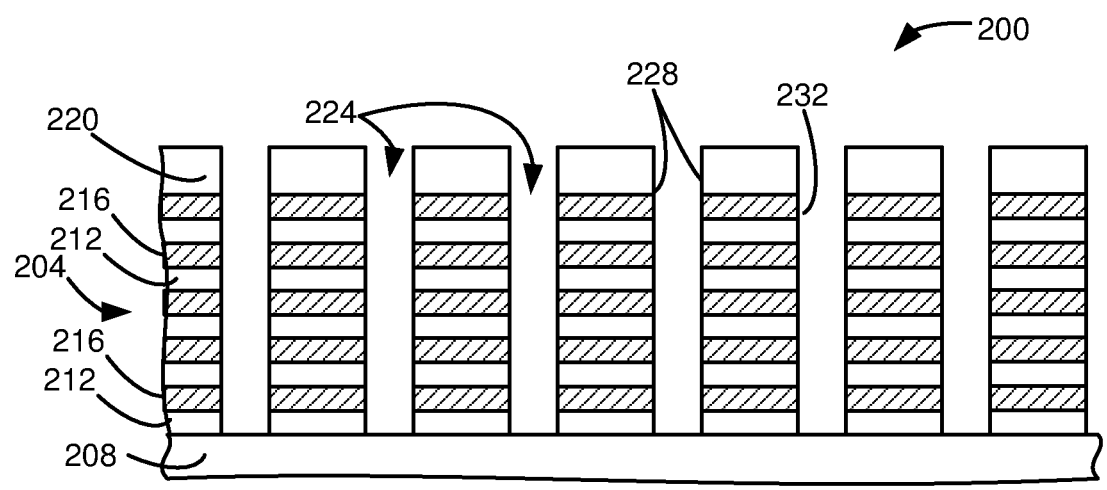

The passivation layer is removed (step 120). In one embodiment, the above etch process completely removes the passivation layer. If some of the passivation layer remains after the above etch process, then a separate passivation removal process may be provided. An example of a recipe for removing the passivation layer provides a flow of 100 sccm $CF_4$ and 20 sccm $O_2$ with a chamber pressure of 20 mT. An RF signal of 1000 W of TCP is provided to form the gas into a plasma. No bias voltage is provided. A wafer temperature of 30° C. is provided. The plasma is maintained for 20 seconds. Then the flow of gas and power may be stopped. FIG. 2E is a cross-sectional view of the stack 200 after passivation layer has been completely removed (step 120).

The process layer on the substrate is removed from the plasma processing chamber 304 (step 124). Additional processing may be performed before or after the substrate is removed from the plasma processing chamber.

This embodiment provides features without bowing that would result if the deposition layer was not provided before completing the etch. Generally, bowing would be caused by sidewall etching near the top of the features, where the deposition layer has been deposited over the sidewalls. Because the deposition layer is highly resistant to sidewall etching, bowing is reduced. Preferably, the thickness of the passivation layer on the sidewalls is less than 2 nm.

Without being limited by theory, it is believed that the deposition deposits a layer comprising silicon, oxygen, and sulfur, and which may further comprise carbon. Such a deposited layer is believed to be highly resistant to various etch processes for etching conductive or dielectric materials such as polysilicon, silicon oxide, silicon nitride, a metal containing layer, such as doped tungsten, or a carbon containing layer. The deposition layer is able to resist sidewall etching in etch processes that use etchants such as $O_2$, $Cl_2$, $SF_6$, $NF_3$, $CF_4$, HBr, and $CH_xF_y$, where x and y are positive integers, when such etchants are used separately.

The deposition layer in an embodiment is formed using $SiCl_4$ and COS to form a plasma. It has been found that providing $SiCl_4$ and COS sequentially, simultaneously, or cyclically has provided passivation as deep as a few microns from the top of the features. The etch resistance has been found to last for 20-1000 seconds for different etch chemistries.

Such an etch resistant layer provides better control of an etch profile, selectivity, line edge roughness, and microloading. With high aspect ratio features, providing passivation species down to a target location deep in the feature becomes more difficult as feature size shrinks. High aspect ratio features in the specification and claims are defined as having a height to width aspect ratio of greater than 20:1. More preferably high aspect ratio features with a height to width ratio of greater than 50:1 are formed using an embodiment. In addition, keeping a straight etch profile without bowing is provided by an embodiment.

If the passivation layer is not as etch resistant, more passivation is needed, which can cause etch stop. The passivation layer used in various embodiments is sufficiently etch resistant, so as to prevent etch stop. Because the deposition layer is etch resistant to a variety of etchants, the deposition layer may be used as passivation for etching many different materials and multiple layers of different materials, such as memory stacks.

It has been found that the deposition layer may be easily removed by a plasma formed from a halogen containing component gas and oxygen. Preferably, the deposition removal gas comprises either $NF_3$ and $O_2$ or $CF_4$ and $O_2$. Since there is a combination of etchants that can easily and completely remove the deposition layer, the deposition layer may be removed without damaging the etched features and with a high throughput.

In an embodiment where $SiCl_4$ and COS are provided separately and cyclically for a few cycles, the process may take longer. However, for small feature sizes with a width less than 20 nm better step coverage and conformality has been found.

It is believed that the deposition layer is formed by a surface reaction between the plasma, because any gas phase reaction process will form a top-heavy deposition and does not have the capability to passivate high aspect ratio features. Although it is believed that the deposition layer further comprises carbon as a result of the carbon component provided by COS, it is difficult to test the deposition layer to prove the presence of carbon. Also it is believed that the passivation layer is a mixture of $SiO_2$, SiC, and $SiS_2$, with $SiS_2$ being the backbone of the structure of the deposition layer. $SiS_2$ is a polymeric material that can form a crosslink structure, which is resistive to either fluorine, chlorine, or oxygen radicals. $SiO_2$ and SiC serve as fillers in this polymer to make a densified thin film to stop the chemical diffusion of reactive species.

Experiments have shown that embodiments provide excellent and improved step coverage compared to other deposition and passivation processes, which include atomic layer deposition (ALD) films of $SiO_2$, SiN, or Si. Embodiments showed improved passivation for both conductive and dielectric process layers. Embodiments also showed improved throughput, since a 5 to 100 second deposition would provide bow protection for etching an ONON layer for about 200 to 1000 seconds. Such a deposition may be used in dielectric cell etch in forming memory.

Various embodiments provide deposition layers that are not self limiting, and therefore do not use atomic layer deposition. As a result, the formation of such deposition layers in various embodiments is much quicker than the formation of a deposition layer using atomic layer deposition. The deposition rate scales with time and plasma power. In addition, in cyclical and sequential embodiments, a purge, which is required for ALD to prevent mixing of gases, is not required by the embodiments. A purge is not needed, because it is not detrimental if the gases have some mixing. The elimination of the requirement for a purge provides even a faster process. In addition, the deposition provides a better deposition than conventional chemical vapor deposition (CVD).

In various embodiments the silicon containing gas may be at least one of the silicon containing gas comprises at least one of $SiH_4$, $SiF_4$, $SiCl_4$, $SiH_xF_y$, $SiH_xCl_y$, $SiF_xCl_y$, wherein x and y are positive integers and x+y=4. Preferably the silicon containing gas is $SiCl_4$.

Other embodiments may use the deposition layer comprising silicon, oxygen, and sulfur for other uses besides sidewall passivation. For example, the deposition layer may be used as an etch mask. In another embodiment, the deposition layer may be used as a spacer. Such a spacer may be used in forming fin structures. Such depositions may be performed in-situ or ex-situ with respect to subsequent processes.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for processing a substrate in a processing chamber, wherein a stack of a plurality of alternating layers is over the substrate, and wherein at least one of the alternating layers is silicon oxide, comprising:
    partially etching features in the plurality of alternating layers of the stack;
    after partially etching features, forming a deposition on sidewalls of the partially etched features in the plurality of alternating layers, comprising:
        flowing a silicon containing gas into the processing chamber;
        flowing a COS containing gas into the processing chamber;
        providing RF power into the processing chamber from at least one transformer coupled plasma (TCP) coil; and
        forming a plasma from the silicon containing gas and the COS containing gas in the processing chamber using the RF power, wherein the plasma provides the deposition on sidewalls of the partially etched features in the plurality of alternating layers; and
    after forming the deposition on sidewalls of the partially etch features is completed, further etching the partially etched features in the plurality of alternating layers of the stack, wherein the deposition protects sidewalls of the partially etched features from the further etching.

2. The method, as recited in claim 1, wherein the deposition comprises silicon, oxygen, and sulfur.

3. The method, as recited in claim 2, wherein the deposition further comprises carbon.

4. The method, as recited in claim 3, wherein the silicon containing gas and COS containing gas are provided cyclically for a plurality of cycles, wherein there is some mixing between the silicon containing gas and the COS containing gas.

5. The method, as recited in claim 1, further comprising removing the deposition.

6. The method, as recited in claim 5, wherein the removing the deposition, comprises:
    providing a removal gas comprising a halogen containing component and $O_2$; and
    forming a plasma from the removal gas, which removes the deposition.

7. The method, as recited in claim 1, wherein the silicon containing gas comprises at least one of $SiH_4$, $SiF_4$, $SiCl_4$, $SiH_xF_y$, $SiH_xCl_y$, $SiF_xCl_y$, wherein x and y are positive integers and x+y=4.

8. The method, as recited in claim 1, wherein the silicon containing gas and COS containing gas are provided simultaneously.

9. The method, as recited in claim 1, wherein the silicon containing gas and COS containing gas are provided sequentially, wherein there is some mixing between the silicon containing gas and the COS containing gas.

10. The method, as recited in claim 1, wherein the silicon containing gas and COS containing gas are provided cyclically for a plurality of cycles, wherein there is some mixing between the silicon containing gas and the COS containing gas.

11. The method, as recited in claim 1, wherein the forming the plasma provides the deposition for a period of between 5 to 100 seconds.

12. The method, as recited in claim 1, wherein the stack further comprises a patterned mask over the plurality of alternating layers, wherein the patterned mask is a carbon hardmask and wherein the carbon hardmask provides a mask for the partial etching partially etching features and further etching the partially etched features.

13. The method, as recited in claim 12, wherein the memory stack is an oxide, nitride, oxide nitride (ONON) memory stack.

\* \* \* \* \*